United States Patent
Bi et al.

(10) Patent No.: US 10,366,928 B2
(45) Date of Patent: Jul. 30, 2019

(54) HYBRIDIZATION FIN REVEAL FOR UNIFORM FIN REVEAL DEPTH ACROSS DIFFERENT FIN PITCHES

(71) Applicant: INTERNATIONAL BUSINESS MACHINES CORPORATION, Armonk, NY (US)

(72) Inventors: Zhenxing Bi, Niskayuna, NY (US); Donald F. Canaperi, Bridgewater, CT (US); Thamarai S. Devarajan, Albany, NY (US); Sivananda K. Kanakasabapathy, Niskayuna, NY (US); Fee Li Lie, Albany, NY (US); Peng Xu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/433,163

(22) Filed: Feb. 15, 2017

(65) Prior Publication Data
US 2018/0090367 A1    Mar. 29, 2018

Related U.S. Application Data

(62) Division of application No. 15/278,747, filed on Sep. 28, 2016, now Pat. No. 9,754,798.

(51) Int. Cl.
*H01L 21/8234* (2006.01)
*H01L 29/06* (2006.01)
(Continued)

(52) U.S. Cl.
CPC .. *H01L 21/823481* (2013.01); *H01L 21/0206* (2013.01); *H01L 21/31111* (2013.01);
(Continued)

(58) Field of Classification Search
None
See application file for complete search history.

(56) References Cited

U.S. PATENT DOCUMENTS

| 8,637,359 B2 | 1/2014 | Chang et al. |
| 9,006,066 B2 | 4/2015 | Chi et al. |

(Continued)

FOREIGN PATENT DOCUMENTS

| CN | 104051539 A | 9/2014 |
| CN | 105576028 A | 5/2016 |

(Continued)

OTHER PUBLICATIONS

List of IBM Patents or Patent Applications Treated as Related dated Feb. 15, 2017, 2 pages.
(Continued)

*Primary Examiner* — Whitney Moore
(74) *Attorney, Agent, or Firm* — Tutunjian & Bitetto, P.C.; Vazken Alexanian

(57) ABSTRACT

A semiconductor device having a uniform height across different fin densities includes a semiconductor substrate having fins etched therein and including dense fin regions and isolation regions without fins. One or more dielectric layers are formed at a base of the fins and the isolation regions and have a uniform height across the fins and the isolation regions. The uniform height includes a less than 2 nanometer difference across the one or more dielectric layers.

18 Claims, 10 Drawing Sheets

(51) Int. Cl.
    *H01L 21/762* (2006.01)
    *H01L 21/02* (2006.01)
    *H01L 21/311* (2006.01)
    *H01L 29/78* (2006.01)
    *H01L 29/66* (2006.01)

(52) U.S. Cl.
    CPC .. *H01L 21/31116* (2013.01); *H01L 21/31138* (2013.01); *H01L 21/76224* (2013.01); *H01L 21/76229* (2013.01); *H01L 21/823431* (2013.01); *H01L 29/0649* (2013.01); *H01L 29/0653* (2013.01); *H01L 29/66795* (2013.01); *H01L 29/7851* (2013.01)

(56) References Cited

U.S. PATENT DOCUMENTS

| | | |
|---|---|---|
| 9,171,935 B2 | 10/2015 | Kim et al. |
| 9,209,178 B2 | 12/2015 | Kanakasabapathy et al. |
| 9,224,840 B2 | 12/2015 | Flachowsky et al. |
| 9,559,014 B1 * | 1/2017 | Basker ............ H01L 21/823821 |
| 9,646,822 B2 | 5/2017 | Ranade |
| 2008/0014699 A1 | 1/2008 | Torek et al. |
| 2009/0302372 A1 | 12/2009 | Chang et al. |
| 2016/0043079 A1 | 2/2016 | Chang et al. |
| 2016/0155670 A1 * | 6/2016 | Liaw ............... H01L 21/823431 257/401 |
| 2016/0181117 A1 | 6/2016 | Arghavani et al. |
| 2017/0053808 A1 | 2/2017 | Kamp et al. |
| 2017/0125286 A1 * | 5/2017 | Briggs ............. H01L 21/31055 |
| 2017/0250281 A1 | 8/2017 | Tsai et al. |
| 2017/0263715 A1 | 9/2017 | Bouche et al. |
| 2017/0278743 A1 | 9/2017 | Tsai et al. |
| 2017/0352541 A1 | 12/2017 | Hsu et al. |
| 2017/0352574 A1 | 12/2017 | Chen et al. |
| 2018/0226291 A1 * | 8/2018 | Hsu ................. H01L 21/823431 |

FOREIGN PATENT DOCUMENTS

| | | |
|---|---|---|
| KR | 1020160018327 A | 2/2016 |
| KR | 1020160075474 A | 6/2016 |
| TW | 201607027 A | 2/2016 |

OTHER PUBLICATIONS

Office Action issued in U.S. Appl. No. 15/718,577 dated Jan. 11, 2018, pp. 1-24.
U.S. Office Action issued in U.S. Appl. No. 15/718,577 dated Apr. 26, 2018, 8 pages.

* cited by examiner

HYBRIDIZATION FIN REVEAL FOR UNIFORM FIN REVEAL DEPTH ACROSS DIFFERENT FIN PITCHES

BACKGROUND

Technical Field

The present invention generally relates to semiconductor processing, and more particularly to methods and structures for fin reveals that preserve shallow trench isolation height (e.g., uniform fin reveal depth) regardless of fin density.

Description of the Related Art

Fin reveal processes typically employ a buffered HF etch process (wet etch) and an oxide removal etch (oxide etch) to reveal fins through an oxide layer during fin field effect transistor manufacturing. The wet etch process etches dense fin region regions (dense regions) at a faster etch rate while the oxide removal etch process etches isolation regions (iso regions) at a faster etch rate. The wet etch process does most of the material removal during the fin reveal, and the oxide removal process tunes the iso region fin reveal depth to attempt to match the fin reveal depth in the dense region. The etch rate of wet etch (e.g., HF) is very sensitive to oxide material quality and volume. When the oxide layer (e.g., shallow trench isolation (STI) material) changes or includes fin pitch changes, the fin reveal process needs to be re-tuned to provide a good balance between iso region and dense region differences. This is very difficult to do especially given the small process window for the two etch processes for the fin reveal, which is not comparable with multi-fin pitch CMOS (complementary metal oxide semiconductor) patterning.

SUMMARY

In accordance with an embodiment of the present invention, a method for uniform fin reveal depth for semiconductor devices includes dry etching a dielectric material to reveal semiconductor fins by a quasi-atomic layer etching (quasi-ALE) process to achieve depth uniformity across different fin pitches. A lateral bias induced by the quasi-ALE process is compensated for by isotropically etching the dielectric material.

Another method for uniform fin reveal depth for semiconductor devices includes forming a liner over semiconductor fins and a substrate; forming one or more dielectric materials over the liner; dry etching the one or more dielectric materials to reveal semiconductor fins by a quasi-atomic layer etching (quasi-ALE) process to achieve depth uniformity across different fin pitches and different material types or qualities; isotropically etching the one or more dielectric materials with a plasma free reactive cleaning or remote plasma etch to compensate for lateral bias induced by the quasi-ALE process; deglazing the one or more dielectric materials to remove footings at the base of the fins to achieve the depth uniformity across different fin pitches and material types or qualities; and recessing the liner to a surface of the one or more dielectric materials.

A semiconductor device having a uniform height across different fin densities includes a semiconductor substrate having fins etched therein and including dense fin regions and isolation regions without fins. One or more dielectric layers are formed at a base of the fins and the isolation regions and have a uniform height across the fins and the isolation regions. The uniform height includes a less than 2 nanometer difference across the one or more dielectric layers.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
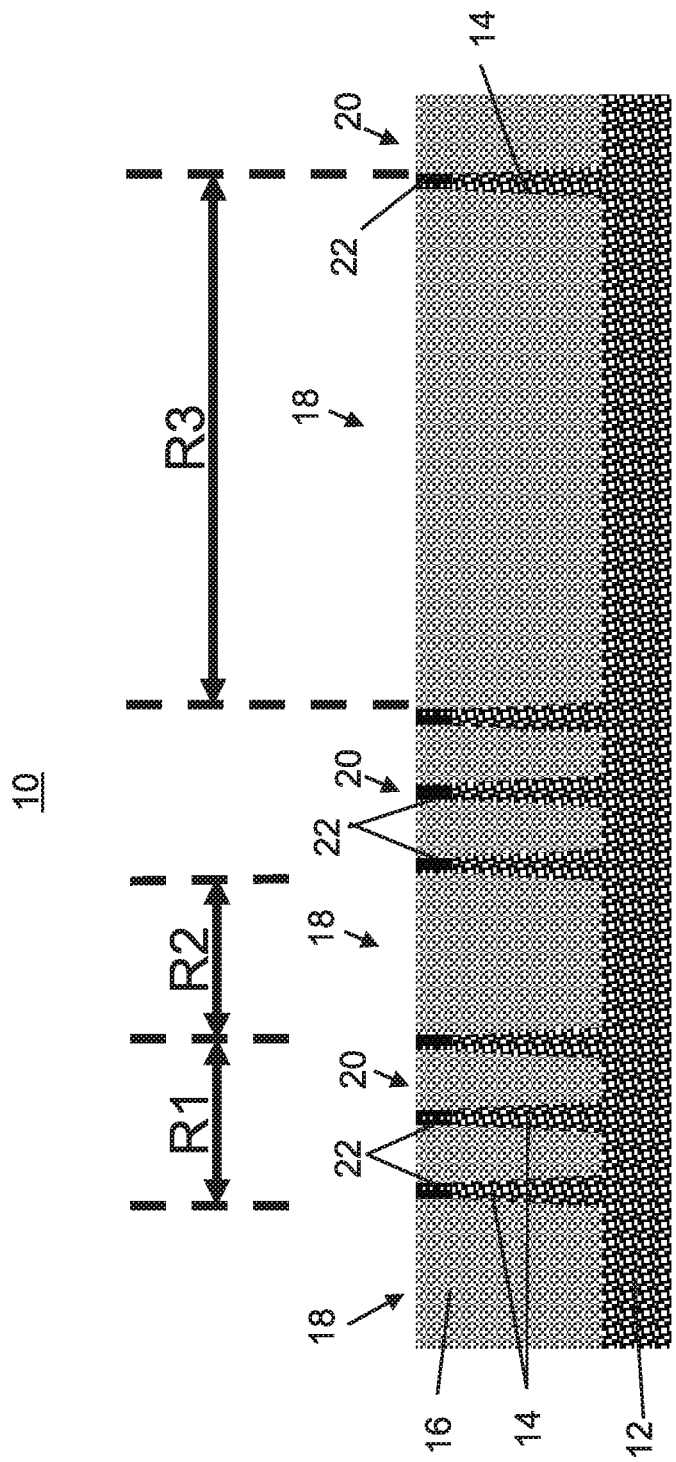
FIG. 1 is a cross-sectional view showing a dielectric layer planarized over fins having different fin pitches or densities in accordance with an embodiment of the present invention.

Embodiments of the present invention provide a hybrid fin reveal method to minimize differences in both vertical and lateral directions for shallow trench isolation material formed about the fins. The hybrid fin reveal provides uniformity across different fin densities and different dielectric quality films. In useful embodiments, a dry fin reveal process is employed such as, e.g., atomic layer etching (ALE), to achieve depth uniformity across different fin pitches. A plasma free reactive clean or remote plasma etch (downstream plasma etch) can then be employed to compensate for a lateral bias induced by the ALE process. An optional deglaze process can be employed to clean up remnants at a footing of the fins.

In other embodiments, fins can be formed with different pattern density regions (e.g., >2 regions), which include a hard mask (e.g., SiN) patterned on top of the fins. A protective etch selective liner can be deposited over the fins in some embodiments. Each region can be filled using dielectric materials (e.g., oxides), and, in some embodiments, materials with different properties may be employed in different regions. A planarization process is employed to planarize the dielectrics to the hard mask.

A dry fin reveal process (e.g., ALE or quasi-ALE) can be employed to achieve depth uniformity across the different fin density regions or different film quality regions. A $N_2H_2$ or $O_2$ plasma strip can be employed to clean a polymer induced by the dry fin reveal process. A reactive clean (e.g., plasma free reactive clean or remote plasma etch/downstream plasma etch) can be employed to compensate for the lateral bias induced by dry etch process. A deglaze process can be employed to remove excess oxide footings, and a hot phosphoric acid etch can be employed to remove a nitride liner, if deposited. Uniformity of shallow trench isolation (STI) dielectric is achieved between regions of different fin densities or STI material quality in both vertical and lateral directions to provide a uniform fin reveal.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It ill be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or features) as illustrated in the FIGS. It will be understood that the spatially relative terms e intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a partially fabricated semiconductor device 10 is illustratively shown. The device 10 includes a substrate 12 that provides a plurality of fin structures 14 etched therein. The substrate 12 in the embodiments shown includes a bulk substrate having fins patterned and etched using a lithographic patterning or other patterning process (e.g., spacer image transfer (SIT), etc.). The patterning process patterns a hard mask 22, which functions as an etch mask for etching the fins 14. The hard mask 22 can include a nitride, other hard mask materials or combinations thereof.

The plurality of fin structures 14 are formed from the substrate 12, which includes a semiconductor material including, but not limited to Si, strained Si, SiC, SiGe, SiGeC, Si alloys, Ge, Ge alloys, GaAs, InAs, InP as well as other III/V and II/VI compound semiconductors. The plurality of fin structures 14 are etched using a reactive ion etch (RIE) or the like. Fin dense regions 20 and fin isolation regions 18 are defined by the layout and dummy fin cut processing.

A dielectric material 16 is deposited over and on the fins 14 and the substrate 12. The dielectric material 16 can be formed by chemical vapor deposition (CVD), flowable CVD (FCVD), ultraviolet curable FCVD, high aspect ratio process (HARP), enhanced HARP (eHARP), etc. Combinations of these and other processes can be employed that can affect the quality of the dielectric material 16.

The removal of the dielectric material 16 to expose the hard mask 22 and/or the fins 14 is referred to as a fin reveal. The fin reveal can include a planarization process and/or one or more etching processes. The dielectric material 16 can include an oxide, forms or oxides, other dielectric materials or combinations of types and qualities of dielectric materials. The dielectric material 16 can be recessed to form a shallow trench isolation (STI) region at the base of the fins 14.

In the embodiment depicted in FIG. 1, three illustrative regions R1, R2 and R3 are shown. R1 represents a dense fin region. R2 represents a region free of fins and having a first pitch (between dense regions), and R3 represents a region free of fins and having a second pitch (between dense regions), which is larger than the first pitch. Each region R1, R2, R3, etc. can include a same dielectric material or a different dielectric material. Many different regions and configurations may be employed instead of or in addition to those depicted. The device 10 is planarized by, e.g., a chemical mechanical polish (CMP) or etch, which stops on the hard mask 22 to planarize the dielectric material 16.

Figure 2:
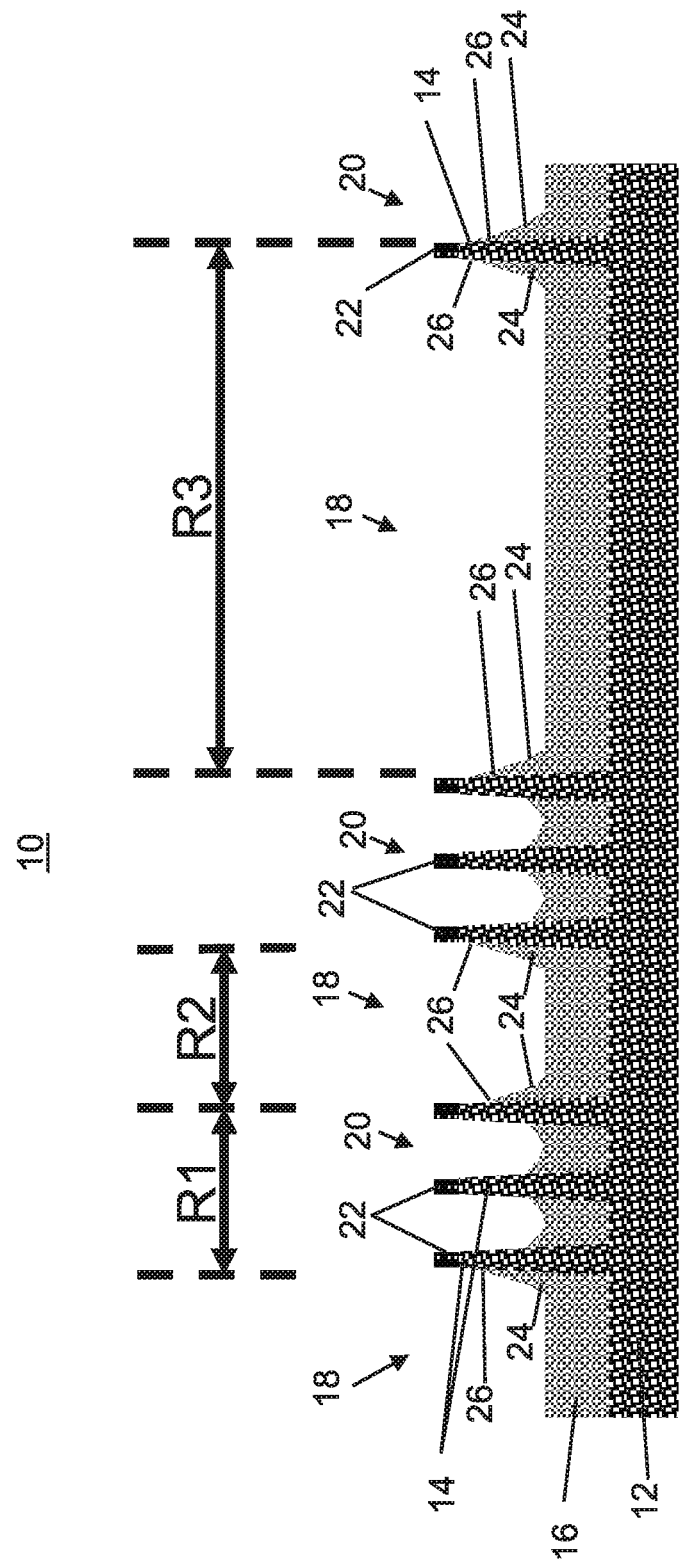
FIG. 2 is a cross-sectional view showing the dielectric layer etched using a dry fin reveal etch which etches isolation regions faster than the dense fin regions and leaves footings and wall deposits on fins adjacent to the isolation regions in accordance with an embodiment of the present invention.

Referring to FIG. 2, the fin reveal process is performed using a dry fin reveal and, in particular, an atomic layer etch (ALE). In a particularly useful embodiment, the ALE process includes a quasi-ALE process or a gas/bias pulsing process.

The quasi-ALE process cycles between a polymer deposition and etch process. The quasi-ALE process is a gas cycling process. One cycle deposits a polymer, the next cycle uses Ar to activate F inside of the polymer to etch dielectric material (e.g., oxide). The quasi-ALE process provides better etch uniformity on large spaces and tight spaces (e.g., STI). The polymer deposits more on silicon nitride as compared to oxide, so it has selectivity to silicon nitride.

The quasi-ALE process employs a capacitive plasma tool with both gas and bias pulsing. For example, quasi-ALE uses Ar atoms to bomb the polymer deposited to activate fluorine inside of the polymer to react with an oxide layer or material. The polymer will deposit selectively on nitride compared to oxide to achieve higher etch selectivity.

The quasi-ALE process has a low vertical etch rate difference between dense regions 20 and iso regions 18. In addition, the quasi-ALE process has a lower lateral etch rate in iso regions 18 as compared with the dense regions 20 due to a higher polymer collection in the lateral dimensions due to several root causes, such as, e.g., sticking coefficient, increased solid angle of acceptance of polymer from phase gas, etc. The quasi-ALE lateral etch rate of dielectric layer 16 is slower in the iso regions 18 than the dense regions 20. A large oxide footing 24 is formed that is left after the quasi-ALE process. A higher polymer collection 26 forms on the fins 14 adjacent to the iso regions 18.

Figure 3:
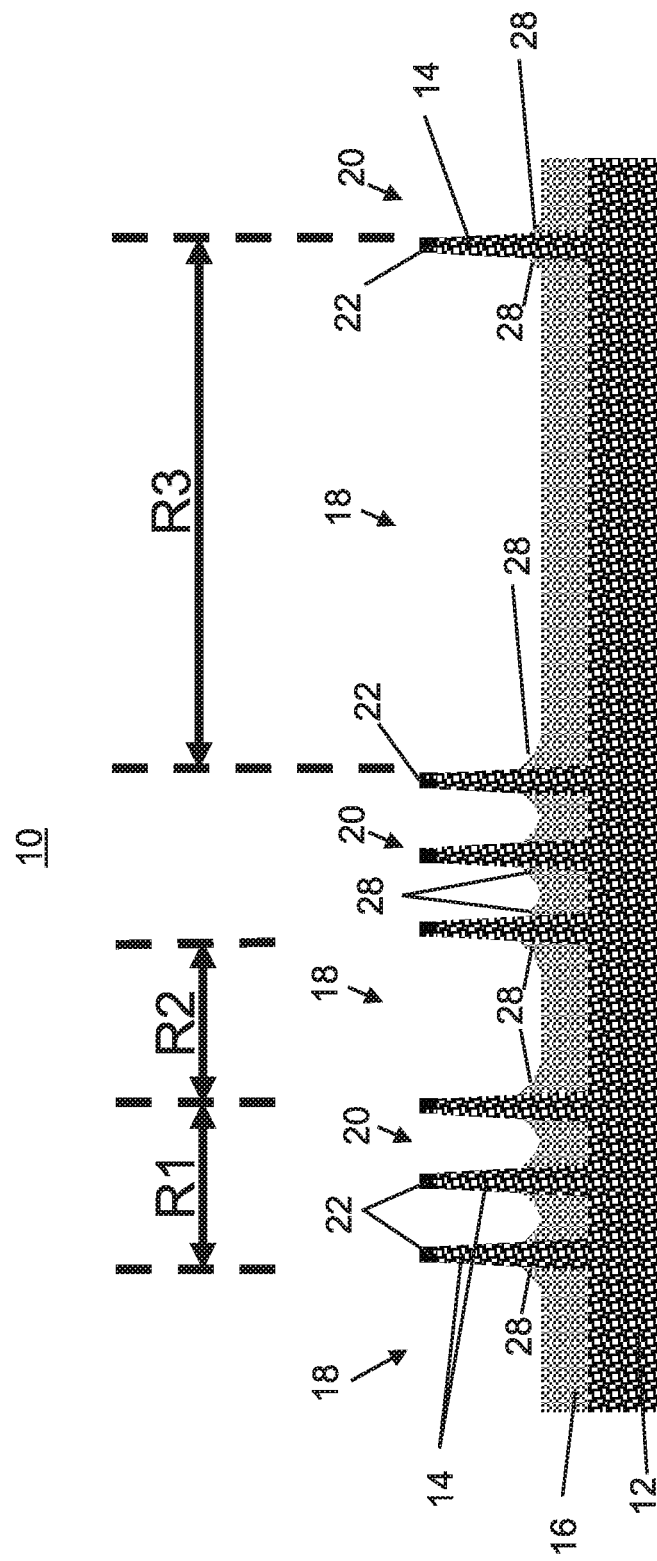
FIG. 3 is a cross-sectional view showing the dielectric layer etched to compensate for undue lateral etch bias from the dry fin reveal using an isotropic etch that etches dense regions faster than the isolation regions at a reverse rate in accordance with an embodiment of the present invention.

Referring to FIG. 3, a strip process is employed to remove the polymer by-product (polymer collection 26). The strip process can include a $N_2H_2$ or $O_2$ plasma strip. The strip process is followed by a plasma free reactive clean or downstream plasma process (remote plasma etch), which is preferably an isotropic etch.

The plasma free reactive clean or downstream plasma process, which can include a cyclic etch process. A cyclic etch process can include $NH_3$/HF delivered and absorbed on the surface to be etched. The surface is then etched using chemicals to react with the surface and form by-products in a self-ended process. Then, the by-products are purged with a slightly high temperature thermal treatment (e.g., about 100 degrees C. or higher). The cyclic etch cycles between chemical reaction and purging. The plasma free reactive clean has no bias, and therefore no plasma kinetic energy to damage the substrate or surface. Mainly chemical reactions occur between (non-accelerated) ions and the etch target to remove a lateral difference in different density regions in an isotropic etch process.

A downstream plasma etch or remote plasma assisted dry etch process is largely conformal and selective towards silicon oxide layers but does not readily etch silicon regardless of whether the silicon is amorphous, crystalline or polycrystalline. The selectivity provides advantages for applications such as STI and inter-layer dielectric (ILD) recess formation. Remote plasma excitation of the active etchant species permits plasma-damage-free processing.

The dry etch process produces solid by-products which grow on the surface of as material is removed. The solid by-products are subsequently removed via sublimation when the temperature is raised.

The plasma free reactive clean or remote plasma etch provides an opposite lateral etch rate (e.g., iso regions 18 etch faster than the dense regions 20 at a same rate as previously etched), which can offset the bias by the quasi-ALE process. The dielectric layer 16 is etched and recessed during the plasma free reactive clean to remove the dielectric material to provide symmetry and leave symmetric footings 28 about the fins 14 in the dielectric layer 16. The footings 28 are now symmetrical for fins 14 adjacent to the iso regions 18 and for fins formed within the dense regions 20.

Figure 4:
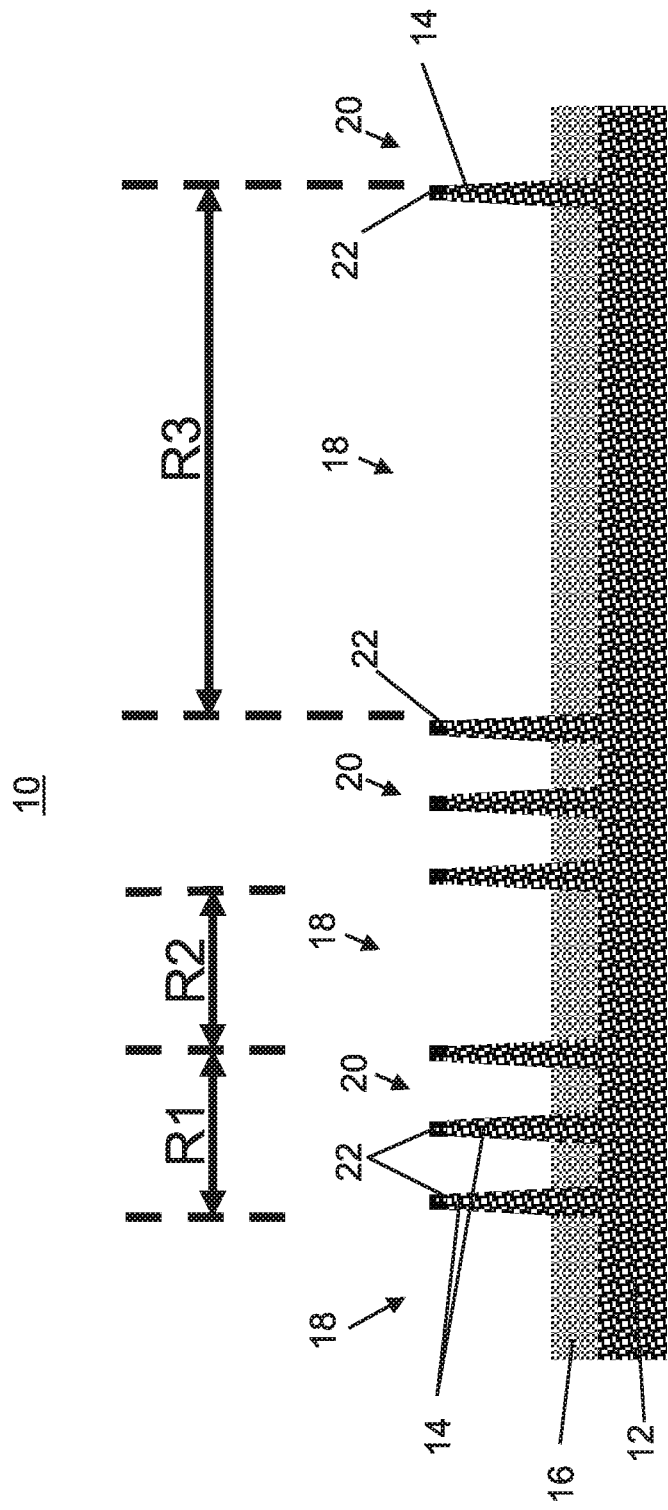
FIG. 4 is a cross-sectional view showing the dielectric layer deglazed to remove footings to provide a uniform dielectric layer reveal depth across all fin densities in accordance with an embodiment of the present invention.

Referring to FIG. 4, an optional deglaze process is performed. The deglaze process can include an HF wet etch. (The deglaze can be a short process which includes a downstream plasma or can also be a wet etch process). The deglaze process removes the footings 28 and cleans up the surface of the dielectric layer 16 to form the STI.

In accordance with the present embodiments, the iso regions 18 and the dense regions 20 can include less than 1 nm difference for both lateral and vertical direction differences. While up to about 2 nm is acceptable, lower lateral and vertical direction differences are desired. The STI (16) remains level throughout the regions R1, R2 and R3, whether there are dense fins 20 or no fins (iso regions 18).

Figure 5:
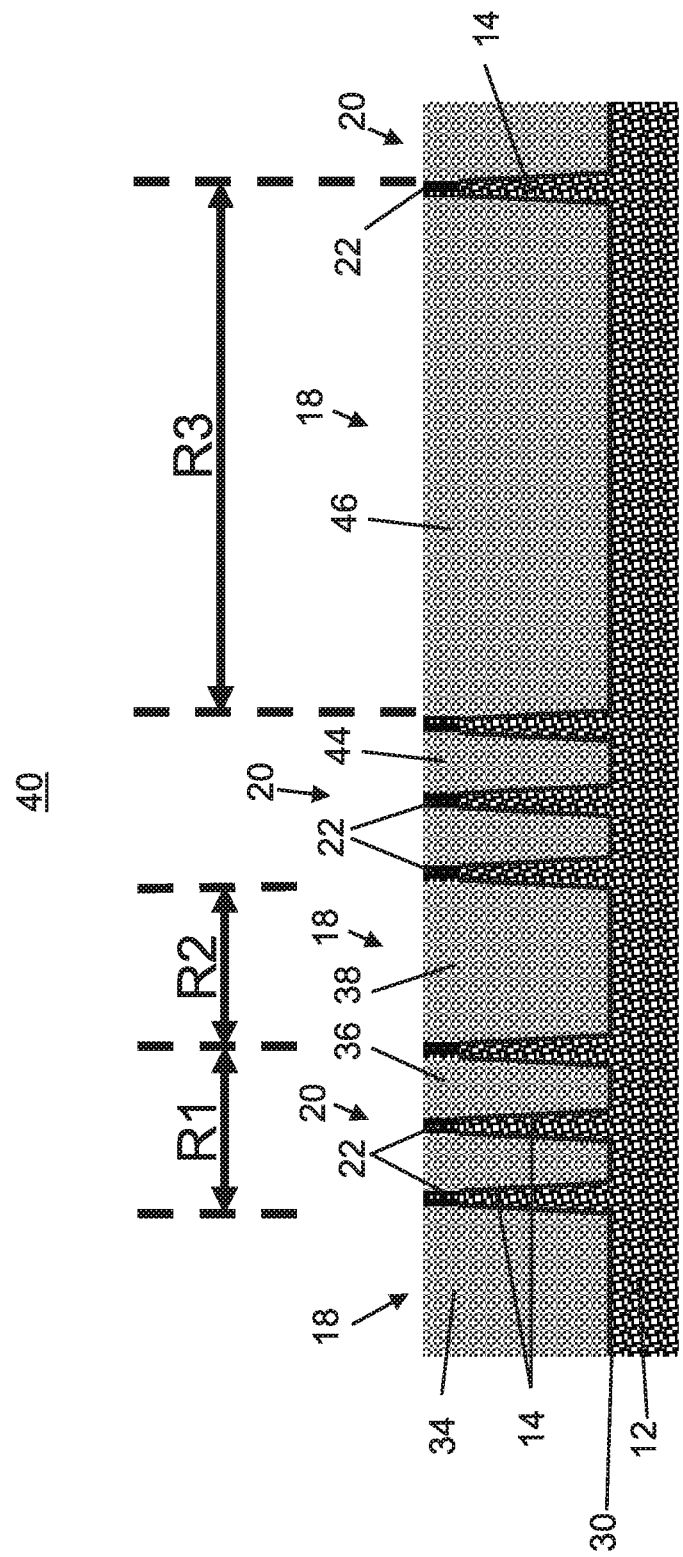
FIG. 5 is a cross-sectional view showing one or more dielectric layer materials being formed over a liner and planarized over fins having different fin pitches or densities in accordance with an embodiment of the present invention.

Referring to FIG. 5, a partially fabricated semiconductor device 40 is illustratively shown. The device 40 includes substrate 12 that provides the plurality of fin structures 14 etched therein. The hard mask 22 can be included.

The plurality of fin structures 14 are formed from the substrate 12. The plurality of fin structures 14 are etched using a reactive ion etch (RIE) or the like. Fin dense regions 20 and fin isolation regions 18 are defined by the layout and dummy fin cut processing.

A liner 30 is formed over the fins 14 and hard mask 22. The liner 30 includes a material that permits selective etching relative to a dielectric material to be formed. The liner 30 can include a nitride, such as silicon nitride, although other dielectric materials may be employed.

Instead of a single dielectric material (16, FIG. 1) or two or more dielectric materials 34, 36, 38, 44, 46 can be deposited over the liner 30. The dielectric materials 34, 36, 38, 44, 46 can include different materials, different forms of the same material, materials formed by different processes, e.g., CVD, FCVD, ultraviolet curable FCVD, HARP, eHARP, etc. In some embodiments, some of the dielectric materials 34, 36, 38, 44, 46 can be the same materials. The present embodiments, provide a uniform lateral and vertical uniformity across different fin densities and the material types or qualities.

In the embodiment depicted in FIG. 5, three illustrative regions R1, R2 and R3 are shown. R1 represents a dense fin region. R2 represents a region free of fins and having a first pitch, and R3 represents a region free of fins and having a second pitch, which is larger than the first pitch. Each region R1, R2, R3, etc. can include a same dielectric material or a different dielectric material. More or less regions may also be employed. The device 40 is planarized by e.g., CMP or etching, which stops on the hard mask 22 to planarize the dielectric materials 34, 36, 38, 44, 46.

Figure 6:
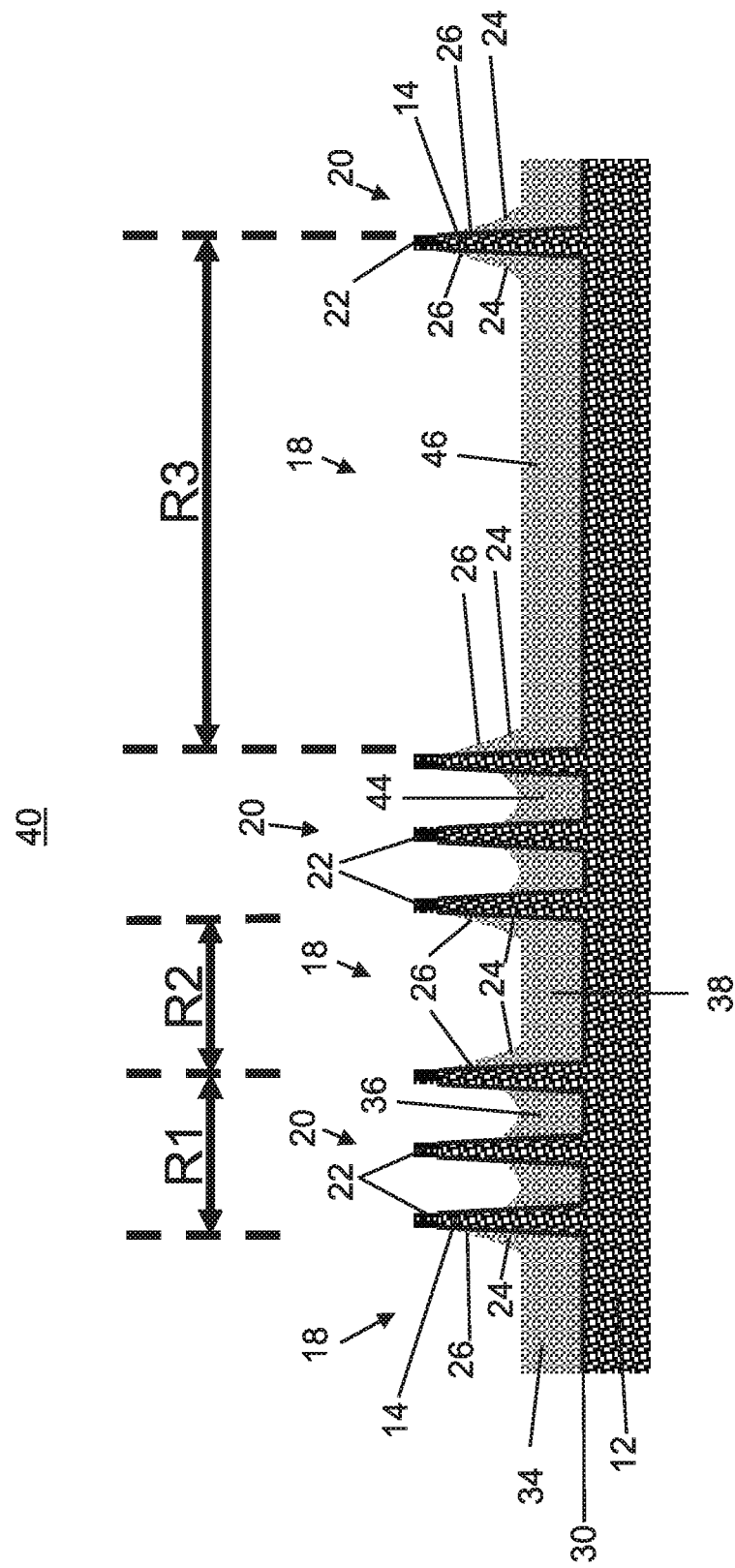
FIG. 6 is a cross-sectional view showing the one or more dielectric layer materials etched using a dry fin reveal etch which etches isolation regions faster than the dense fin regions and leaves footings and wall deposits on fins adjacent to the isolation regions in accordance with an embodiment of the present invention.

Referring to FIG. 6, the fin reveal process is performed using a dry etch process, such as, e.g., a quasi-ALE process. In one embodiment, the quasi-ALE process cycles between a polymer deposition and etch process. The quasi-ALE process has a low vertical etch rate difference between dense regions 20 and iso regions 18. The quasi-ALE lateral etch rate of dielectric material 34, 36, 38, 44, 46 is slower in the iso regions 18 than the dense regions 20. The large oxide footing 24 is formed, which is left after the quasi-ALE process. Higher polymer collection 26 forms on the fins 14 adjacent to the iso regions 18.

Figure 7:
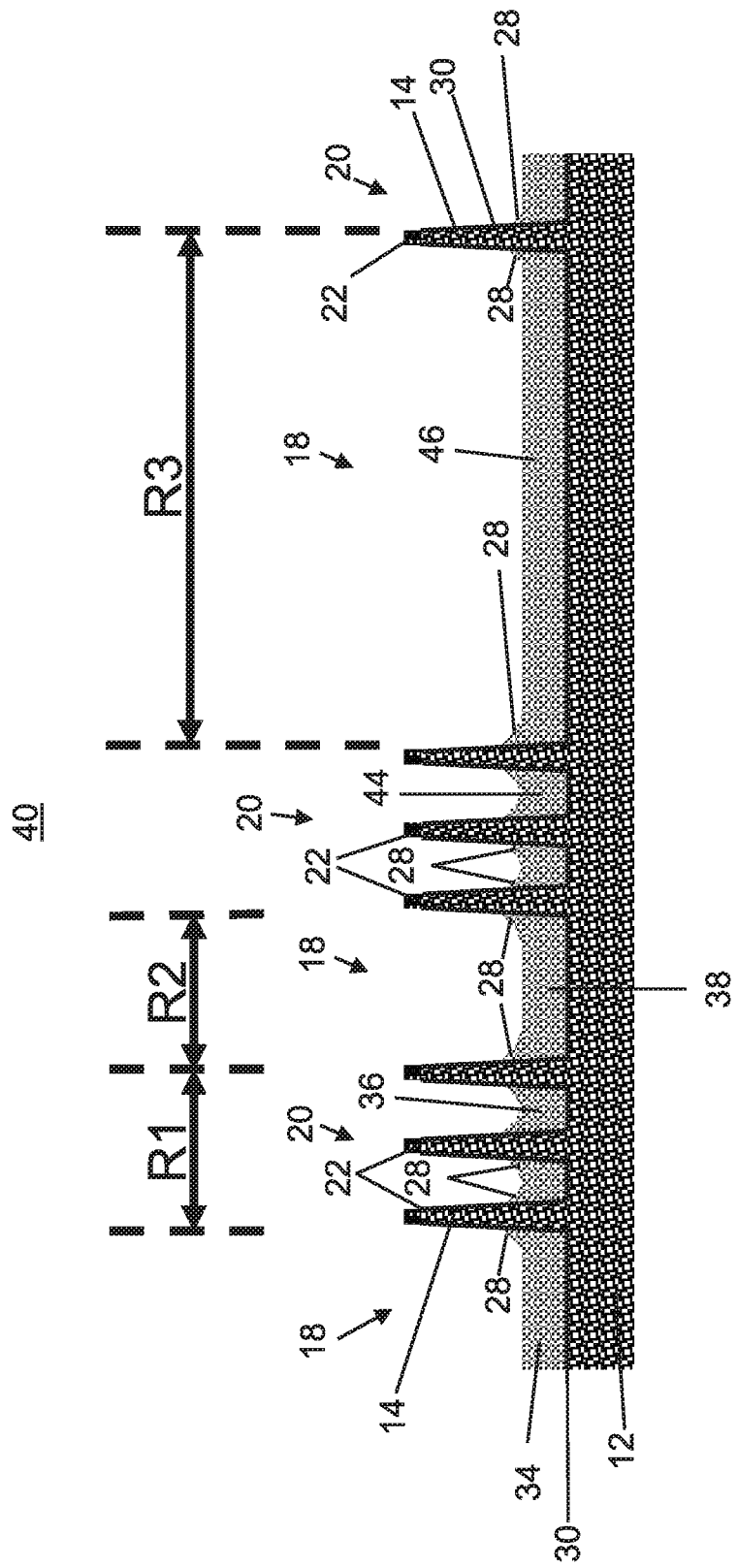
FIG. 7 is a cross-sectional view showing the one or more dielectric layer materials etched to compensate for undue lateral etch bias from the dry fin reveal using an isotropic etch that etches dense regions faster than the isolation regions at a reverse rate in accordance with an embodiment of the present invention.

Referring to FIG. 7, a strip process is employed to remove the polymer by-product (polymer collection 26). The strip process can include a $N_2H_2$ or $O_2$ plasma strip. The strip process can be followed by a plasma free reactive clean or downstream plasma/remote plasma etch. The plasma free reactive clean or remote plasma etch can include an isotropic etch, which includes an opposite lateral etch rate (e.g., iso regions 18 etch faster than the dense regions 20 at a same rate as previously etched), which can offset the bias by the quasi-ALE process. The dielectric material 34, 36, 38, 44, 46 is etched and recessed during the plasma free reactive clean to remove the dielectric material (e.g. oxide) to provide symmetry and leave symmetric footings 28 about the fins 14 in the dielectric material 34, 36, 38, 44, 46. The footings 28 are become symmetrical for fins 14 adjacent to the iso regions 18 and for fins formed within the dense regions 20.

Figure 8:
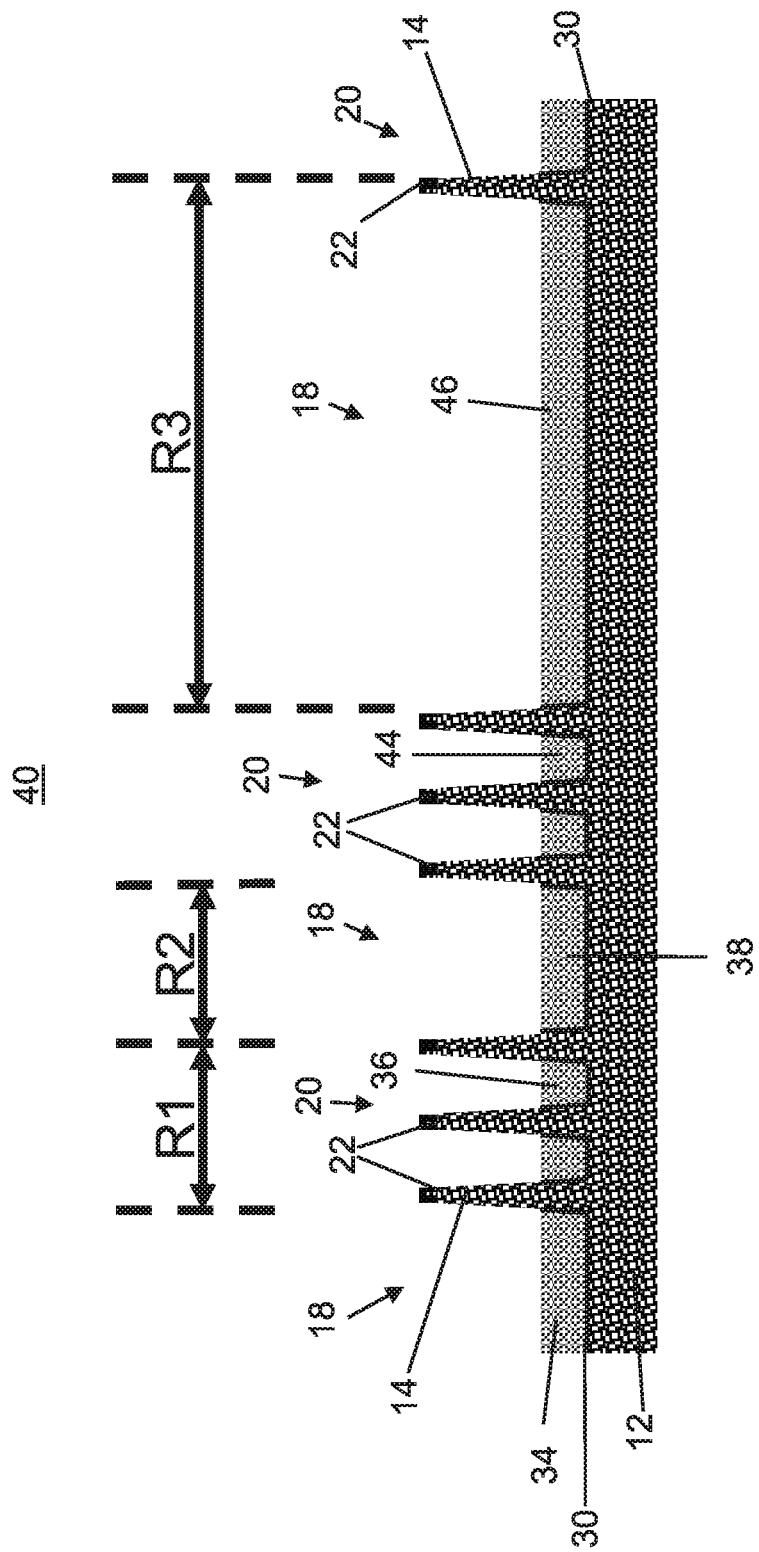
FIG. 8 is a cross-sectional view showing the one or more dielectric layer materials deglazed to remove footings to provide a uniform dielectric layer reveal depth across all fin densities and dielectric layer materials in accordance with an embodiment of the present invention.

Referring to FIG. 8, an optional deglaze process is performed. The deglaze process can include an HF etch. The deglaze process removes the footings 28 and cleans up the surface of the dielectric 34, 36, 38, 44, 46 to form the STI.

In accordance with the present embodiments, the iso regions 18 and the dense regions 20 can include less than 1 nm difference for both lateral and vertical direction differences. While up to about 2 nm is acceptable, lower lateral and vertical direction differences are desired. The STI (34, 36, 38, 44, 46) remains level throughout the regions R1, R2 and R3, whether there are dense fins 20 or no fins (iso regions 18). The liner 30 is recessed to the surface of the STI 34, 36, 38, 44, 46. The liner 30 can be etched using a hot phosphoric acid etch.

In FIGS. 4 and 8 (or FIGS. 3 and 7), processing continues with the formation of gate structures, source/drain regions, contact formation, metal lines, etc. While the present embodiments may be employed with any fin pitch, it should be understood that the present embodiments are particularly useful for sub 40 nm fin pitches.

Figure 9:
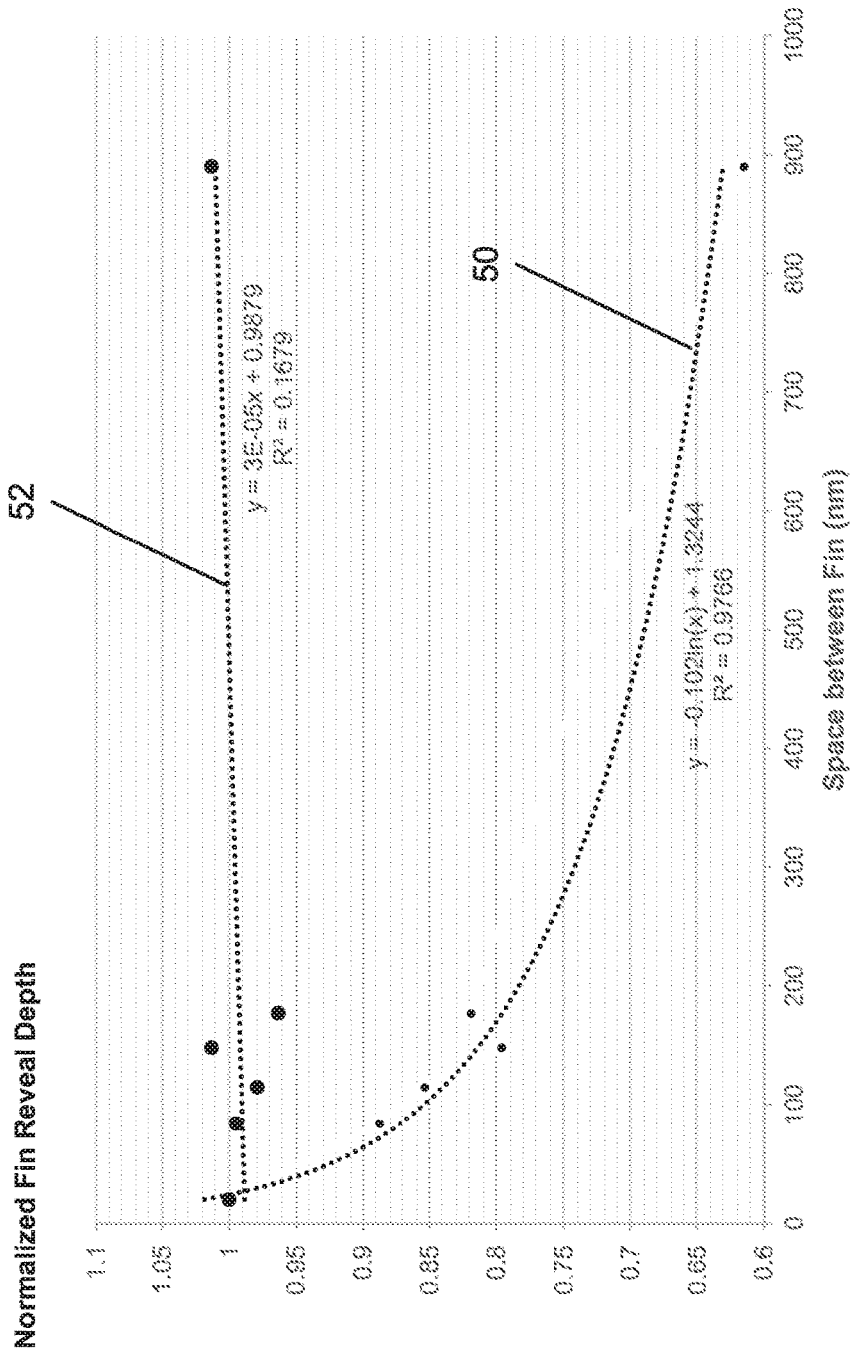
FIG. 9 is a plot of normalized fin reveal depth versus space between fins (nm) showing a linear relationship in accordance with an embodiment of the present invention.

Referring to FIG. 9, a plot of normalized fin reveal depth versus space between fins (nm) is shown. A trace 50 shows a logarithmic relation (y=0.102*ln(x)+1.3244) for a conventional process. For high density fins, the logarithmic relationship rapidly changes resulting in large variations of reveal depths for small changes in fin density. In accordance with the present embodiments, a trace 52 shows a linear relation (for example: $y=3\times10^{-5}*x+0.9879$) for a process in accordance with embodiments of the present invention. For high density fins, the linear relationship changes very little resulting in negligible variations of reveal depths for changes in fin density. While other relationships are contemplated, these relationships illustrate aspects of the present invention.

Figure 10:
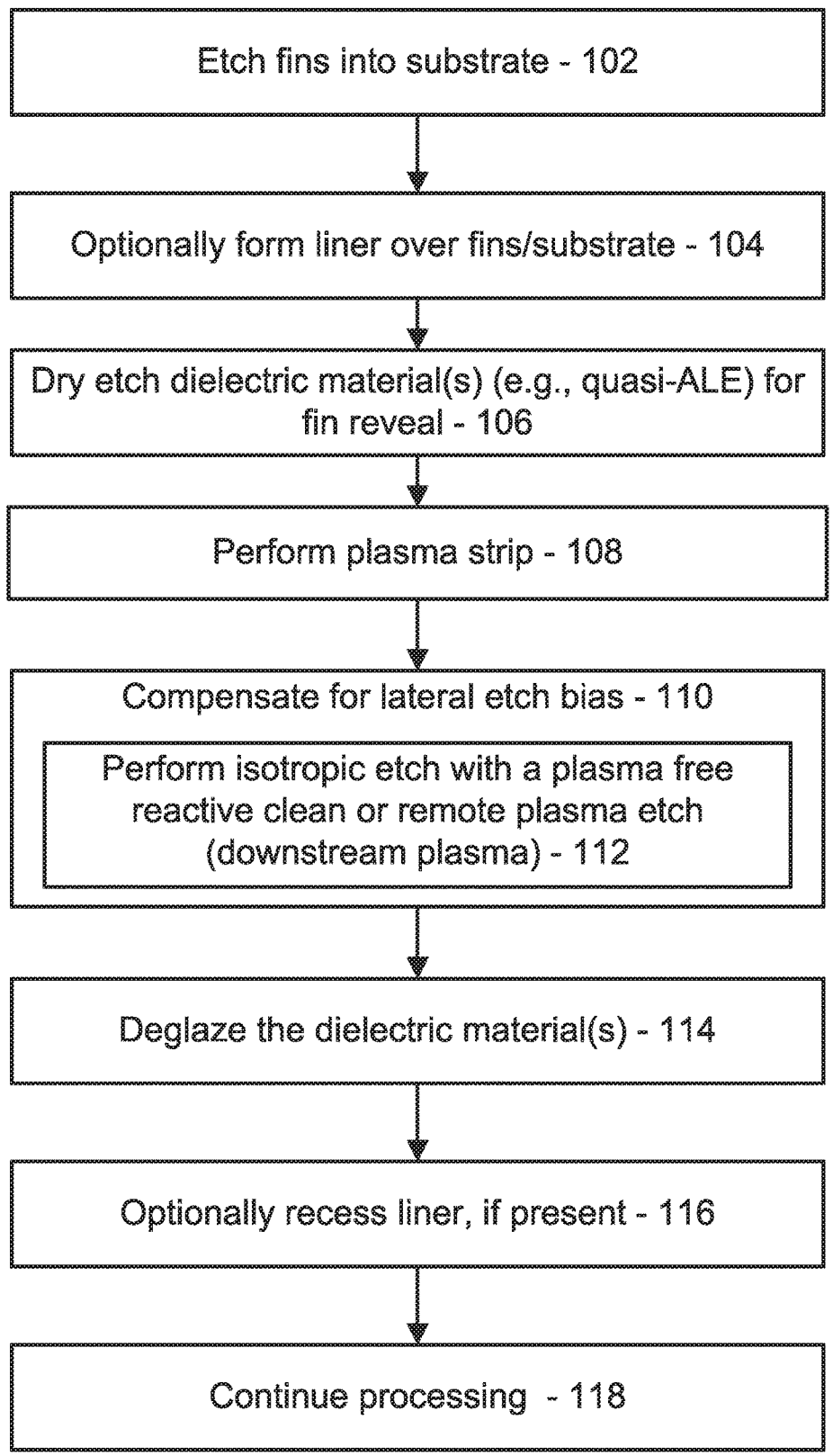
FIG. 10 is a block/flow diagram showing a method for uniform fin reveal depth for semiconductor devices in accordance with an embodiment of the present invention.

Referring to FIG. 10, methods for uniform fin reveal depth for semiconductor devices are illustratively shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, fins are etched into a semiconductor substrate using a hard mask or other etch mask patterned on the fins. In block 104, an optional liner is formed over the fins and the substrate. In block 106, a dielectric material or dielectric materials are deposited over different fin regions. If the liner is employed, selective deposition or block masks may be employed to form different dielectric materials or different dielectric qualities in different fin regions (e.g., dense or iso regions of different densities or qualities).

In block 106, a dry etch is performed to provide a fin reveal that removes the dielectric material or materials to reveal the fins. The dry etch can include a quasi-ALE process to achieve depth uniformity across different fin pitches. The quasi-ALE process includes a plurality of cycles of: depositing a polymer, and etching the polymer and dielectric material (or materials) to achieve the depth uniformity across different fin pitches.

The quasi-ALE process includes a plurality of gas and bias pulse cycles of depositing a polymer with embedded etchant and removing the polymer to release the etchant to remove the dielectric material. The quasi-ALE process results in polymer collection on fin side walls and footings (oxide) left on fins adjacent to iso regions. The quasi-ALE process includes a lower lateral etch rate in iso regions as compared with the dense regions.

In block 108, a plasma strip can be employed to remove the polymer collection on the fin side walls and footings left on fins adjacent to iso regions. The plasma strip can include $N_2H_2$ plasma or $O_2$ plasma.

In block 110, compensation for lateral bias induced by the quasi-ALE process is performed. For example, a lower lateral etch rate in dense regions is provided as compared with the iso regions. Compensation can be performed using an isotropic etch performed on the dielectric material to compensate for the lateral bias. Since the quasi-ALE process laterally etches isolation regions without fins slower than dense fin regions, a compensation etch reversely etches the isolation regions faster than the dense fin regions.

In block 112, the compensation etch can include a plasma free reactive clean or downstream plasma/remote plasma etch employed as an isotropic oxide removal process.

In block 114, a deglazing process may be performed on the dielectric material or material to remove remaining footings at the base of the fins to achieve the depth uniformity across different fin pitches and material types or qualities. The deglazing can include an HF etch or the like.

In block 116, the liner, if present, is recessed to a surface of the one or more dielectric materials. The liner can be recessed by a hot phosphoric etch. The liner is particularly useful when multiple dielectric materials are employed for the STI dielectric. The liner can include a nitride where the dielectric material can include an oxide. In block 118, processing continues to form finFETs and other components, such as contacts, metal lines, dielectric layers, etc.

Having described preferred embodiments for hybridization fin reveal for uniform fin reveal depth across different fin pitches (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device having a uniform height across different fin densities, comprising:
    a semiconductor substrate having fins etched therein and including dense fin regions having respective groups of the fins and dielectric material and isolation regions including the dielectric material without fins, at least two of the isolation regions having different lengths including a first isolation region having a first length defined between a first dense fin region and a second dense fin region, and a second isolation region having a second length defined between the second dense fin region and a third dense fin region; and
    one or more dielectric layers formed at a base of the fins in respective ones of the dense fin regions and the isolation regions and each having a uniform height across the dense fin regions and the isolation regions, the uniform height including a less than 2 nanometer difference across the one or more dielectric layers.

2. The device as recited in claim 1, wherein the one or more dielectric layers include a same dielectric material formed by a different process.

3. The device as recited in claim 1, wherein one of the one or more dielectric layers includes a different dielectric material than at least another one of the one or more dielectric layers.

4. The device as recited in claim 1, further comprising a liner formed below the one or more dielectric materials.

5. The device as recited in claim 1, wherein a fin reveal depth includes a linear relationship with space between the fins.

6. The device as recited in claim 1, wherein a normalized fin reveal depth includes negligible variation over spacings from about 0 nm to about 1000 nm.

7. The device as recited in claim 1, wherein the uniform height includes a less than 1 nanometer difference across the one or more dielectric layers.

8. A semiconductor device having a uniform height across different fin densities, comprising:
    a semiconductor substrate having fins etched therein and including dense fin regions having respective groups of the fins and dielectric material and isolation regions including the dielectric material without fins, at least two of the isolation regions having different lengths including a first isolation region having a first length defined between a first dense fin region and a second dense fin region, and a second isolation region having a second length defined between the second dense fin region and a third dense fin region;
    a liner formed over the semiconductor substrate; and
    one or more dielectric layers formed at a base of the fins in respective ones of the dense fin regions and the isolation regions and each having a uniform height across the dense fin regions and the isolation regions, the uniform height including a less than 2 nanometer difference across the one or more dielectric layers.

9. The device as recited in claim 8, wherein the one or more dielectric layers include a same dielectric material formed by a different process.

10. The device as recited in claim 9, wherein one of the one or more dielectric layers includes a different dielectric material than at least another one of the one or more dielectric layers.

11. The device as recited in claim 9, wherein a fin reveal depth includes a linear relationship with space between the fins.

12. The device as recited in claim 9, wherein a normalized fin reveal depth includes negligible variation over spacings from about 0 nm to about 1000 nm.

13. The device as recited in claim 9, wherein the uniform height includes a less than 1 nanometer difference across the one or more dielectric layers.

14. A semiconductor device having a uniform height across different fin densities, comprising:
- a semiconductor substrate having fins etched therein and including dense fin regions having respective groups of the fins and dielectric material and isolation regions including the dielectric material without fins; and
- one or more dielectric layers formed at a base of the fins in respective ones of the dense fin regions and the isolation regions and each having a uniform height across the dense fin regions and the isolation regions, the uniform height including a less than 2 nanometer difference across the one or more dielectric layers, and one of the one or more dielectric layers includes a different dielectric material than at least another one of the one or more dielectric layers.

15. The device as recited in claim 14, further comprising a liner formed below the one or more dielectric materials.

16. The device as recited in claim 14, wherein a fin reveal depth includes a linear relationship with space between the fins.

17. The device as recited in claim 14, wherein a normalized fin reveal depth includes negligible variation over spacings from about 0 nm to about 1000 nm.

18. The device as recited in claim 14, wherein the uniform height includes a less than 1 nanometer difference across the one or more dielectric layers.

\* \* \* \* \*